United States Patent [19]
Lee et al.

[11] Patent Number: 5,351,309
[45] Date of Patent: Sep. 27, 1994

[54] IMAGE EDGE SENSOR

[75] Inventors: Si-Chen Lee; Wen-Jyh Sah, both of Taipei, Taiwan

[73] Assignee: National Science Council, Taipei, Taiwan

[21] Appl. No.: 906,737

[22] Filed: Jun. 30, 1992

[51] Int. Cl.$^5$ ............................ G06K 9/48; G06K 9/20
[52] U.S. Cl. .......................................... 382/22; 382/66; 382/67; 250/202; 250/208.1
[58] Field of Search ....................... 382/22, 67, 68, 66, 382/60; 250/208.1, 208.2, 202, 206

[56] References Cited

U.S. PATENT DOCUMENTS 5,144,684 9/1992 Inada et al. ............................ 382/67

OTHER PUBLICATIONS

Sah et al., "Amorphous Siicon Four Quadrant Orientation Detector (FOQUOD) for Application to Neural Network Image Sensors," IEEE (1990).

Primary Examiner—David K. Moore
Assistant Examiner—Phuoc Tran
Attorney, Agent, or Firm—Fish & Richardson

[57] ABSTRACT

An image sensor comprised of an array of photo-sensing devices is devised to generate digital images of objects. Each photo-sensing device consists of four identically shaped photo-sensitive surfaces, each photo-sensing surface being shaped into an isosceles trapezoid having 45° base angles. One photo-sensing device corresponds to one pixel of the digital image. Pixels that representing image edges can be directly located and orientations of image edges represented by those pixels can both be determined by arithmetically processing the values of electrical signals generated by the photo-detecting devices.

7 Claims, 19 Drawing Sheets

IMAGE EDGE SENSOR

BACKGROUND OF THE INVENTION
1. Field of the Invention

The present invention relates to an image sensor comprised of an array of detecting cells for detecting images. Specifically, the image sensor is capable of extracting edges of detected images and determining the orientations (tangential directions) of edge points of the detected images.

2. Description of Prior Art

Pattern recognition is a technical field in which a machine is designed to be capable of visually perceiving objects as human eyes. Present pattern recognition machines customarily employ CCD (Charge Coupled Device) or CID (Charge Injection Device) for detecting photons reflected from objects and incident thereupon and generating thereby electrical signals representing analog image signals. The thus generated analog image signals are subsequently converted into digital image signals by means of analog-to-digital converters. The digital image signals can then be processed by general purpose computer systems running pattern recognition softwares for analysis of the image pattern.

Although present computer systems are provided with very high processing speed, pattern recognition speed thereof is still far behind that achieved by human visual nerves. It is therefore the purpose of recent research programs directed on developments of neural network systems, in which electronic circuits are arranged to process signals in a way that resembles functions performed by human visual nerve cells.

According to studies in neurophysiology, when an image is projected upon the retina of a human eye, the human visual neurons for the first step perform a function of extracting the edges of the visualized image and then the brain neurons for the next step perform a function of determining orientations, i.e. tangential directions, of all edge points of the visualized image. In other words, signals concerning locations and orientations of edge points of the visualized image are firstly generated by the human visual neurons for subsequent processing by the human brain. A reference to the details of these functions can be made to a book "*From Neuron to Brain*", 2nd Ed , co-authored by S. W. Kuffler, J. G. Nicholls, and A. R. Martin, and published by Sinauer, Sunderland, Mass., 1984.

Consequently, to simulate these functions performed by the human retina and brain, a pattern recognition machine must be able to determine locations and orientations of the edge points of a detected image. A pioneer work on this technical field has been conducted by Dr. Carver Mead of California Institute of Technology. A reference to the work of Dr. Mead can be made to one of his textbook entitled "*Analog VLSI and Neural Systems*", published by Addison Wesley, Reading, Mass., 1989.

Furthermore, Wen-Jyh Sah et al. of Department of Electrical Engineering at National Taiwan University, who are also the inventors of the present invention, have developed an image sensor comprised of an array of photodetecting cells having specially shaped photo-sensitive surfaces. Each photo-detecting cell is technically dubbed as "a four-quadrant orientation detector (FOQUOD)". The work of Sah et al. has been published in a technical paper entitled "*Amorphous Silicon Four Quadrant Orientation Detector (FOQUOD) for Application to Neural Network Image Sensors*" on TECHNICAL DIGEST of the 1990 IEDM, pp. 291-294, 1990. A brief description of the FOQUOD will be made hereinunder with references made to FIGS. 1-7.

Referring to FIGS. 1-2, a pattern recognition system is configured by utilizing an image sensor 2 consisting of a 16×16 array of FOQUODs. A camera lens (not shown) is customarily used to focus images of objects onto the image sensor 2. One FOQUOD corresponds to one pixel in the converted digital image. As shown more clearly in FIG. 2, an individual FOQUOD consists of four photo-diodes having their photo-sensitive surfaces formed in the shape of a right triangle with equilateral sides. Functions of the thus formed four photo-sensitive surfaces are described in the aforementioned technical paper.

A scanning circuit 20 is used in combination with a pair of multi-plexers 21, 22 to select at a time one of the output currents $I_1$-$I_3$ and $I_2$-$I_4$ of the FOQUODs. An analog-to-digital converters (A/D) 31, which is embodied by using a Keithley 485 picoammeter, is used to convert the output currents $I_1$-$I_3$ and $I_2$-$I_4$ to binary signals. The binary signals are processed further by a computer 40 to determine if an edge segment falls upon the FOQUOD being selected and further determine the orientation of the image edge segment.

Physically, an image edge is a borderline between an illuminated region and a non-illuminated region. Since the FOQUOD is small in size, an image edge segment that falls upon one individual FOQUOD can be substantially regarded as a straight line segment.

It is assumed that a 2-D rectangular coordinate system having an X-axis and a Y-axis is imposed onto the plane on which the image sensor 2 is disposed. The orientation of an image edge segment detected by one FOQUOD is therefore defined as the slope of the image edge segment in the rectangular coordinate system. In rectangular coordinate system, the slope of a line is defined in general as being equal to tan($\Theta$), where $\Theta$ is a polar angle of the line with respective to the X-axis.

Referring to FIG. 3, when the FOQUOD is practically implemented on a semiconductor chip, there are two crossed strips of non-photosensitive region provided to separate the four photo-sensitive surfaces from each other. The side length of the FOQUOD is designated by w and a length left at both ends of each side for the non-photosensitive region is designated by t.

Referring to FIG. 4, an image edge represented by a line L is shown, which passes through the center point O of the FOQUOD and is oriented with an angle $\Theta$ with respect to the X-axis. It has been found that when the angle $\Theta$ is proximate 45° or 135°, i.e. the image edge is substantially in coincidence with one of the strips of non-photosensitive region, the area of illuminated portions of the non-photosensitive region is comparable to the area of illuminated portions of the photo-sensitive surfaces of the FOQUOD. Consequently, a detected orientation error between the detected orientation determined by the computer 40 and the actual orientation is larger in this case.

A first theoretical simulation is therefore conducted to find the effect of the non-photosensitive region on the detected orientation error, in which the line L is rotated about the center point O of the FOQUOD from $\Theta=0°$ to $\Theta=90°$ with a predetermined increment and at each angle $\Theta$ the detected orientation $\Theta_m$ is calculated in accordance with the areas of the presumed "illuminated portions" to the right of the line L. The simulation is carried out by a computer program. Three samples of FOQUOD are sketched and input to the computer program for the simulation, each with a different width for the non-photosensitive region thereof, i.e.

t/w=0,025,
t/w=0.05, and
t/w=0.15 respectively. The results for the three FOQUOD samples are plotted in a graph shown in FIG. 5, wherein the abscissa represents orientations of the line L rotated from $\Theta=0°$ to $\Theta=90°$ and the ordinate represents errors between calculated orientations $\Theta_m$ and actual orientation $\Theta$. It can be seen from the graph of FIG. 5 that the plot corresponding to t/w=0.025 varies leasts about an axis representing zero detected orientation error. Accordingly, it is found that a smaller t for the width of the non-photosensitive region will result in lower detected orientation errors.

Referring to FIG. 6, a second simulation is conducted to see how detected orientation error $\Theta_m$-$\Theta_a$ is related to the width of the non-photosensitive region with respect to image edges having a same orientation but falling upon different segments of the FOQUOD. In the second simulation, the orientation of the line L is fixed at $\Theta_a=55.5°$ and the line L is shifted horizontally along the X-axis to different positions. A reference axis Z having arbitrarily marked units is sketched to indicate positions of the line L, in which Z=±9 are where the line L shifts to boundary positions intersecting vertices of the FOQUOD and Z=0 is where the line L passes through the center point O of the FOQUOD. The line L shifts from the position Z=−9 to the position Z=9 with a predetermined increment and at each position Z the detected orientation $\Theta_m$ is calculated in accordance with the areas of the presumed "illuminated portions" to the right of the line L. The simulation is carried out three times with the same three FOQUOD samples used in the first simulation. The results are plotted in a graph shown in FIG. 7, wherein the abscissa represents the position of the line L shifted from Z=−9 to Z=9 and the ordinate represents errors between the calculated orientation $\Theta_m$ and $\Theta_a$. It can be seen from the graph of FIG. 7 that the plot corresponding to t/w=0.025 varies leasts about an axis representing zero detected orientation error.

As revealed by the results of the foregoing two simulations, performance of the FOQUOD can be enhanced by decreasing the ratio t/w, in other words, by decreasing the width of the non-photosensitive region. However, due to limited capability in fabrication technology, there exist a minimum width achievable for the non-photosensitive region. Consequently, when the size of FOQUOD is intended to be made smaller to incorporate more FOQUODs in a single chip, only the side length of the FOQUOD and not the width of the non-photosensitive region can be further reduced. Therefore, further decreasing w will only result in an increase of the ratio t/w. Incorporating denser FOQUODs in a single chip is therefore restricted. Research effort has been therefore undertaken for an improvement on the FOQUOD so that performance would be as good with a larger t/w ratio.

SUMMARY OF THE INVENTION

It is therefore a primary object of the present invention to provide an image sensor consisting of an array of improved photo-detecting cells having specially shaped photo-sensing surfaces for converting an optical image to a digital image, in which pixels representing image edge can be directly located and orientations of image edge points represented by those pixels can be immediately determined.

In accordance with the object of the present invention, an edge detecting cell is provided with four photo-sensing devices, each of which includes a photo-sensing surface having a shape of an isosceles trapezoid having 45° base angles. The four photo-sensing surfaces are linked together with the isosceles sides thereof in mesh with one another. The four photo-sensing devices generate electrical signals in proportion to the areas of illuminated portions upon the photo-sensing surfaces thereof.

The orientation of the image edge detected by the edge detecting cell is determined by evaluating the ratio of a difference between the electrical signals generated by one pair of oppositely arranged photo-sensing devices to a difference between the electrical signals generated by another pair of oppositely arranged photo-sensing devices.

If both of the differences between the electrical signals generated by both pair of oppositely arranged photo-sensing devices are zero values, then there is not detected an image edge by the detecting cell.

BRIEF DESCRIPTION OF THE DRAWINGS

The present invention can be more fully understood by reading the subsequent detailed description of the preferred embodiments thereof with references made to the accompanying drawings, wherein FIGS. 8–17 are used to depict an image sensor of the present invention, wherein:

FIG. 1 is a schematic diagram of a pattern recognition system utilizing an image sensor comprised of an array of prior art photo-detecting cells;

FIG. 2 is a schematic diagram of a prior art image edge sensing device;

FIG. 3 shows a layout of the photo-sensitive surfaces of an implemented photo-detecting cell utilized in the prior art image edge sensing device of FIG. 2;

FIG. 4 shows the implemented photo-detecting cell of FIG. 3 when it is partly illuminated, used to depict now a first simulation is conducted;

FIG. 5 is a graph, showing the results of the first simulation depicted in FIG. 4;

FIG. 6 shows the implemented photo-detecting cell of FIG. 3 when it is partly illuminated, used to depict now a second simulation is conducted;

FIG. 7 is a graph, showing the results of the second simulation depicted in FIG. 6;

FIG. 8 is a schematic diagram of a pattern recognition system utilizing an image sensor comprised of an array of photo-detecting cells devised in accordance with the present invention;

FIG. 9 is a schematic diagram used to depict the function of an individual photo-detecting cell utilized in the pattern recognition system of FIG. 8;

FIG. 10 is a geometrical illustration, used to explain principles of the present invention;

FIG. 11 shows a layout of the photo-sensitive surfaces of an implemented photo-detecting cell;

FIG. 12 shows the implemented photo-detecting cell of FIG. 11 when it is partly illuminated, used to depict how a first simulation is conducted;

FIG. 13 is a graph, showing the results of the first simulation depicted in FIG. 12;

FIG. 14 shows the implemented photo-detecting cell of FIG. 11 when it is partly illuminated, used to depict how a second simulation is conducted;

FIG. 15 is a graph, showing the result of the second simulation depicted in FIG. 14;

FIG. 17 shows an equivalent circuit of two oppositely disposed photo-diodes in the photo-detecting cell of FIG. 11.

Figure 1:
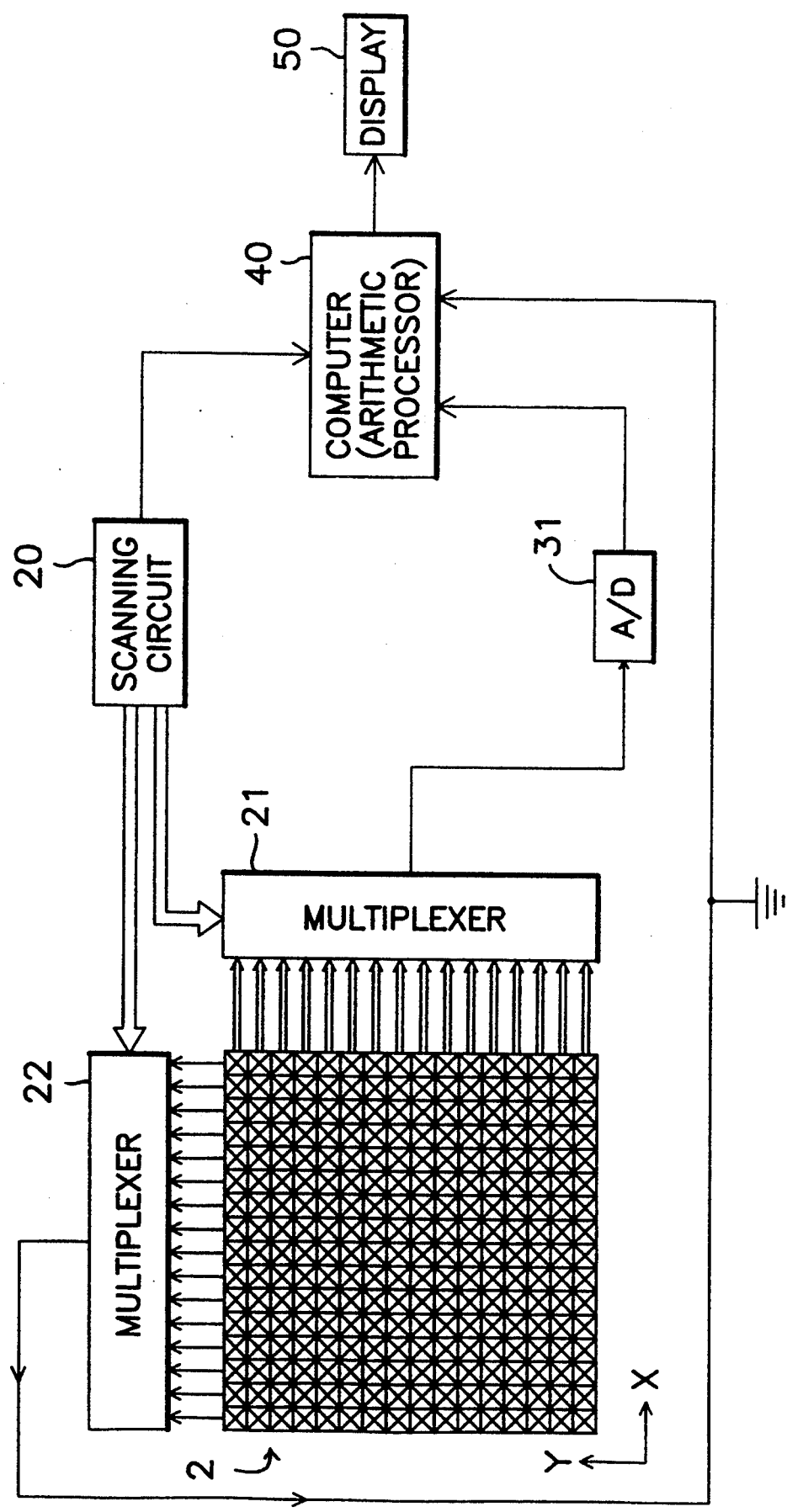
FIGS. 1–7 are used to depict a prior art image sensor.
Figure 2:
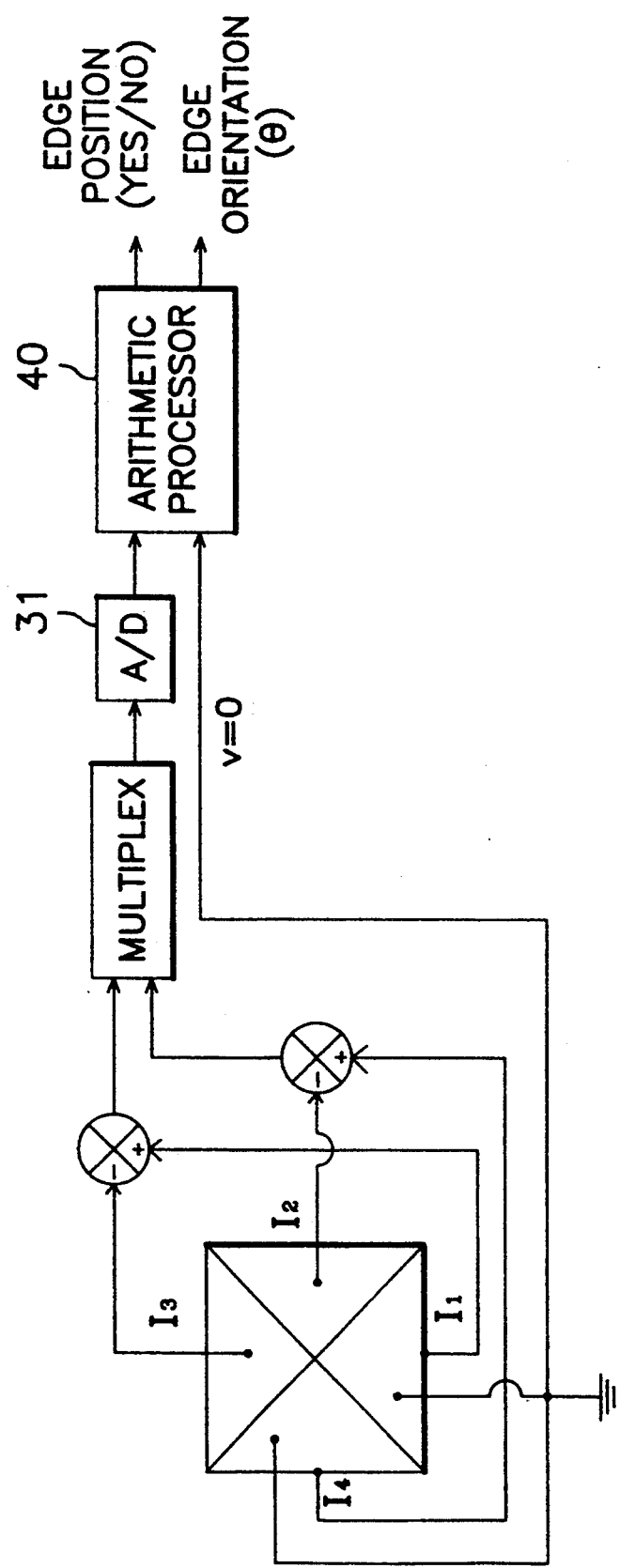
Figure 3:
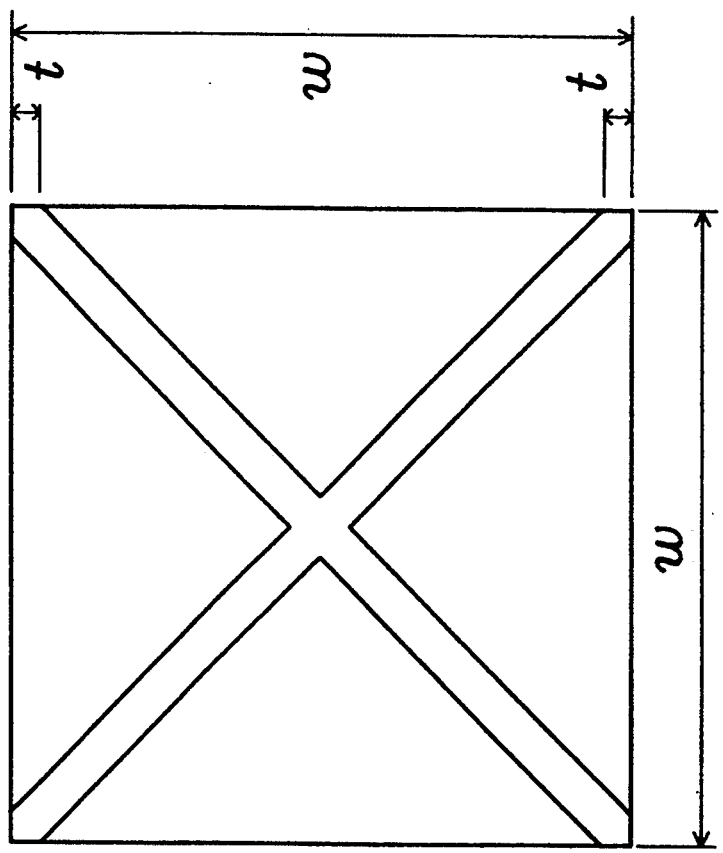
Figure 4:
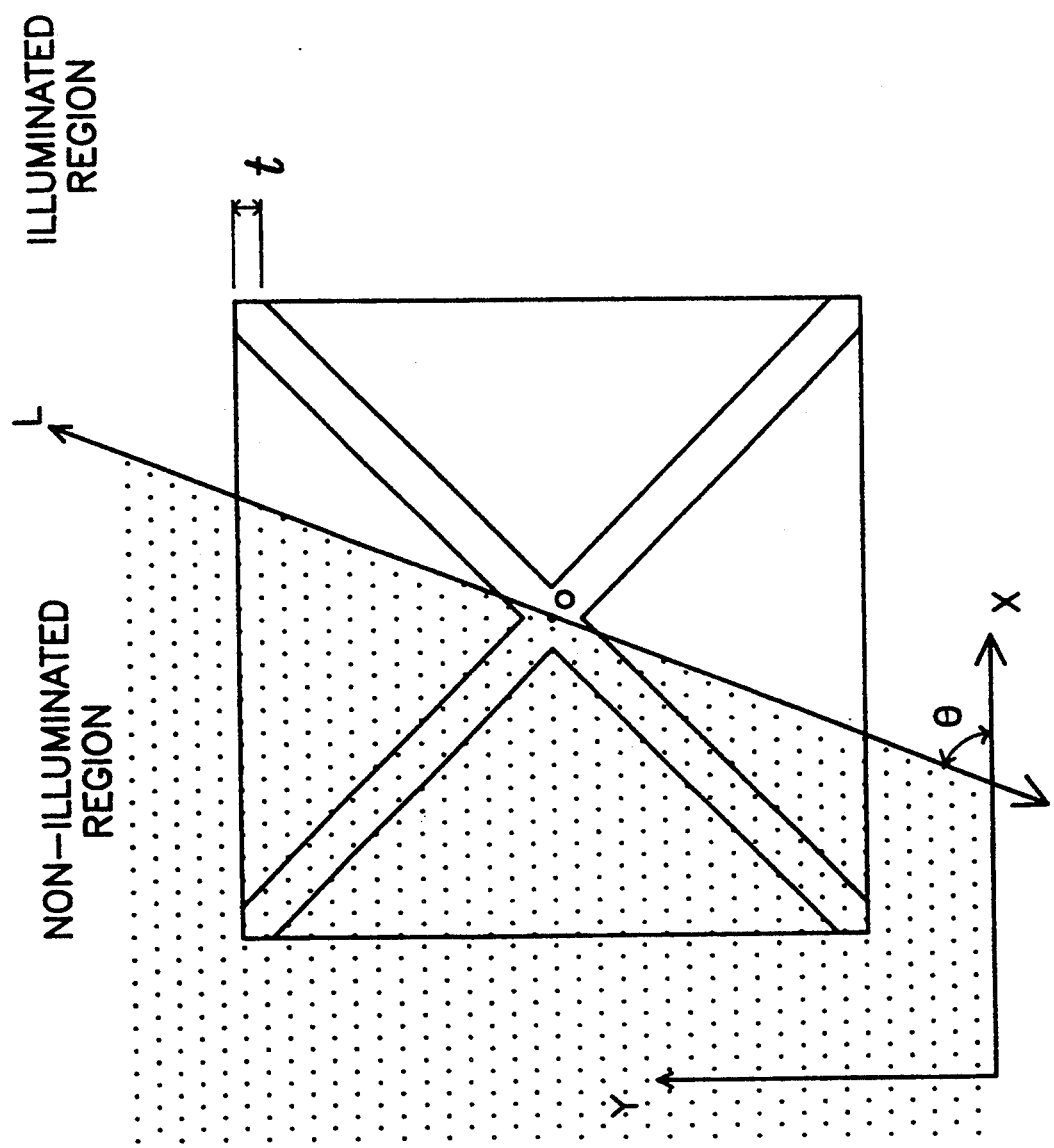
Figure 5:
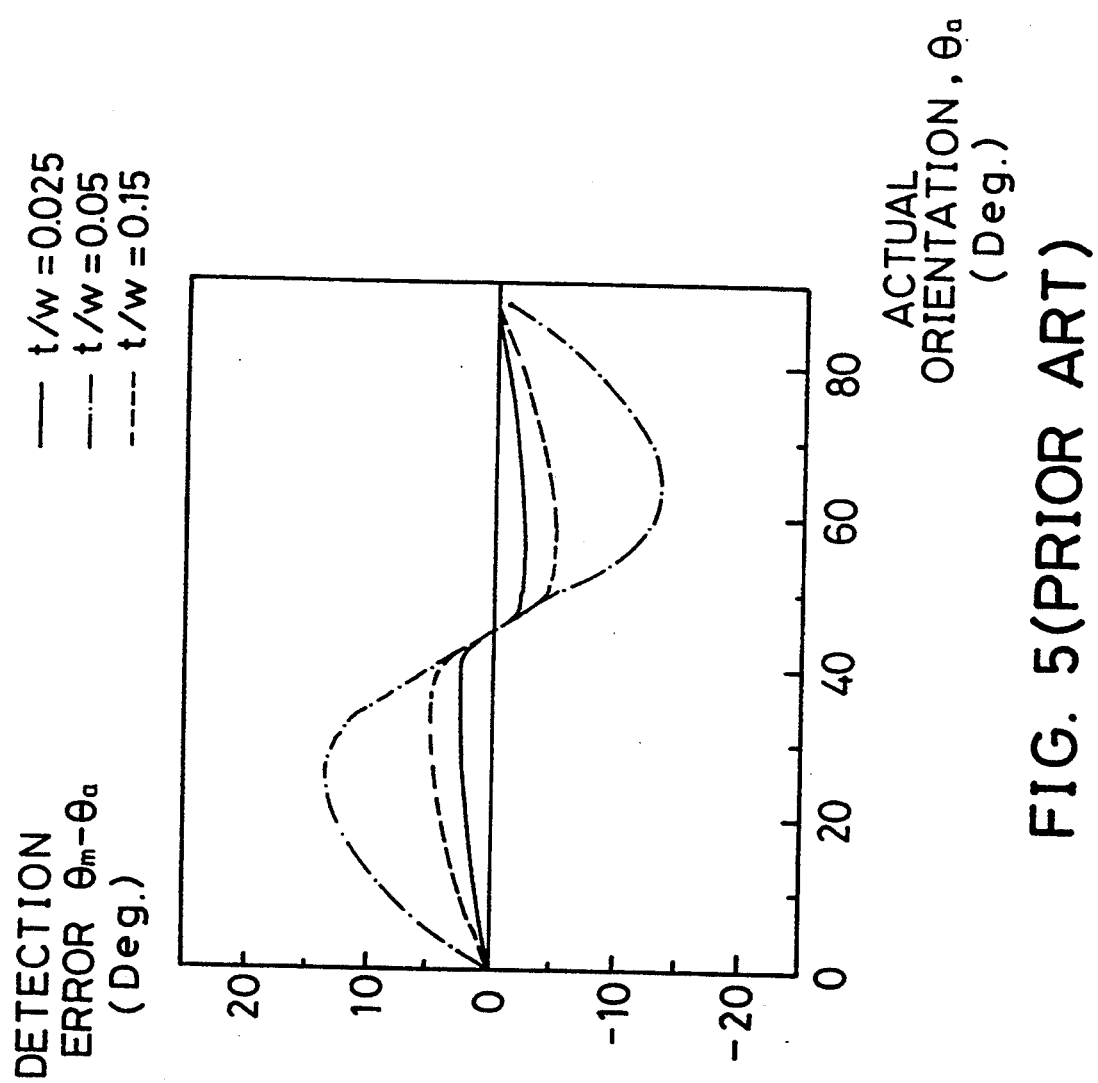
Figure 6:
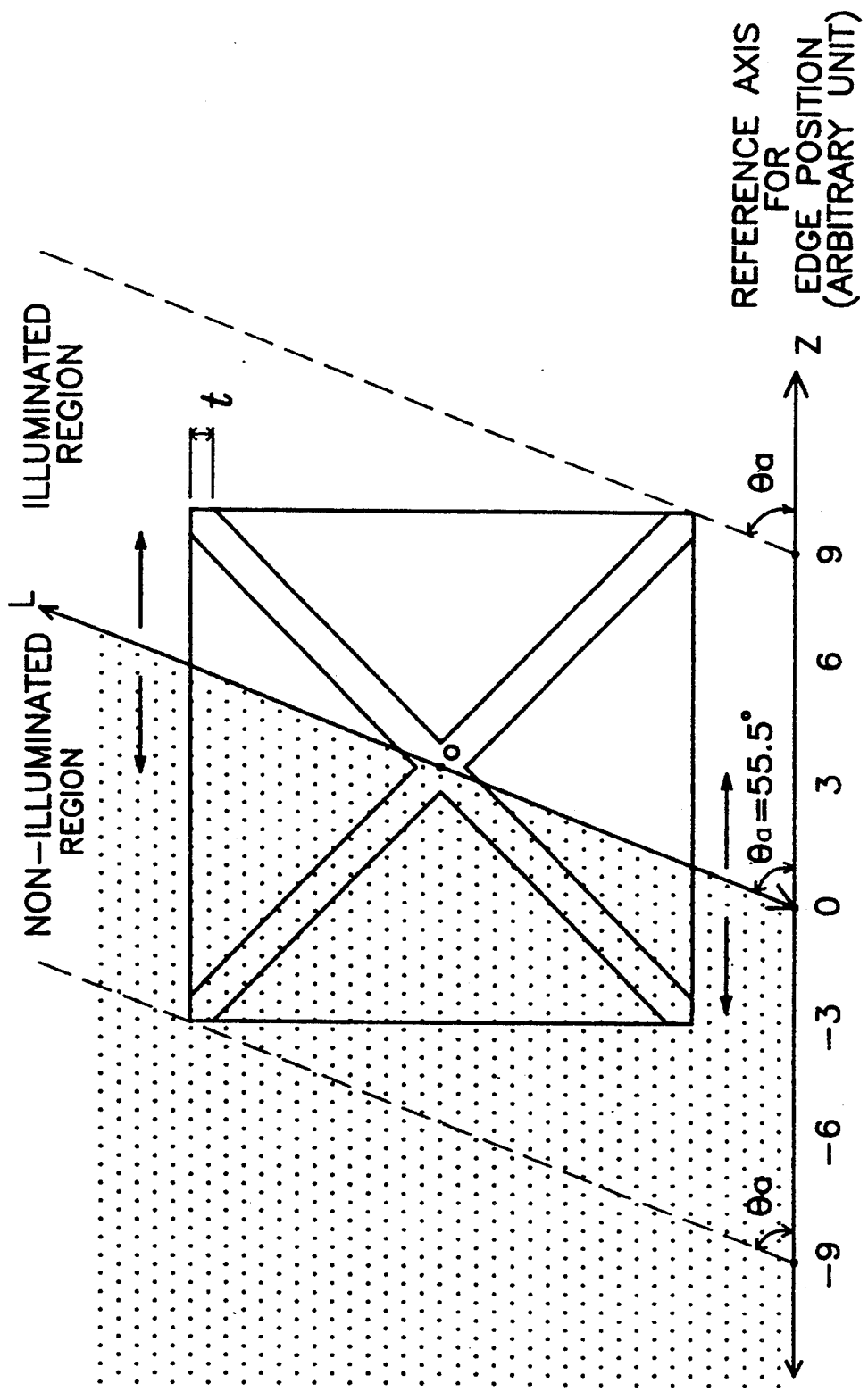
Figure 7:
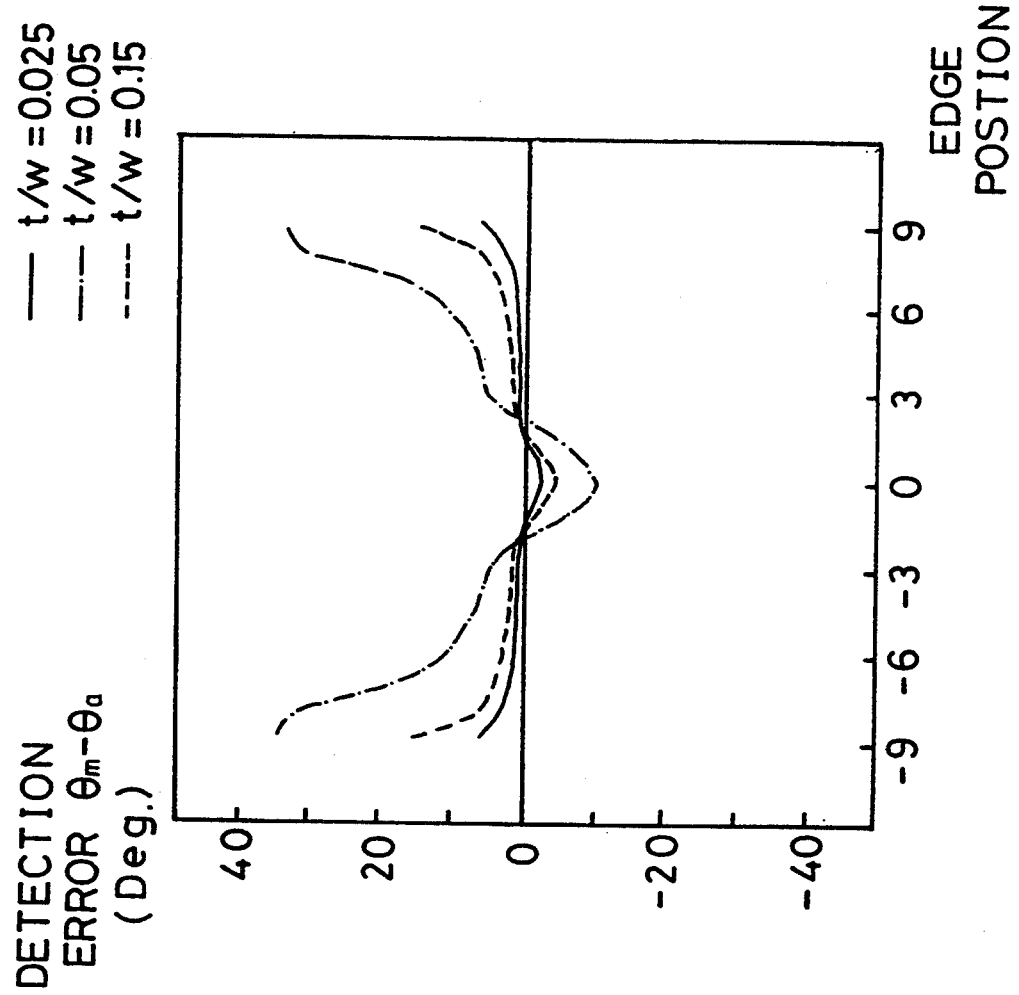

DETAILED DESCRIPTION OF THE PREFERRED EMBODIMENTS SCHEMATIC CONFIGURATION OF AN IMAGE EDGE SENSING DEVICE

The embodiment of the present invention will be hereinafter described with references made to FIG. 8 through FIG. 17. Elements that are unchanged in view of the prior art system shown in FIG. 1 through FIG. 7 will be designated by the same reference numerals.

Figure 8:
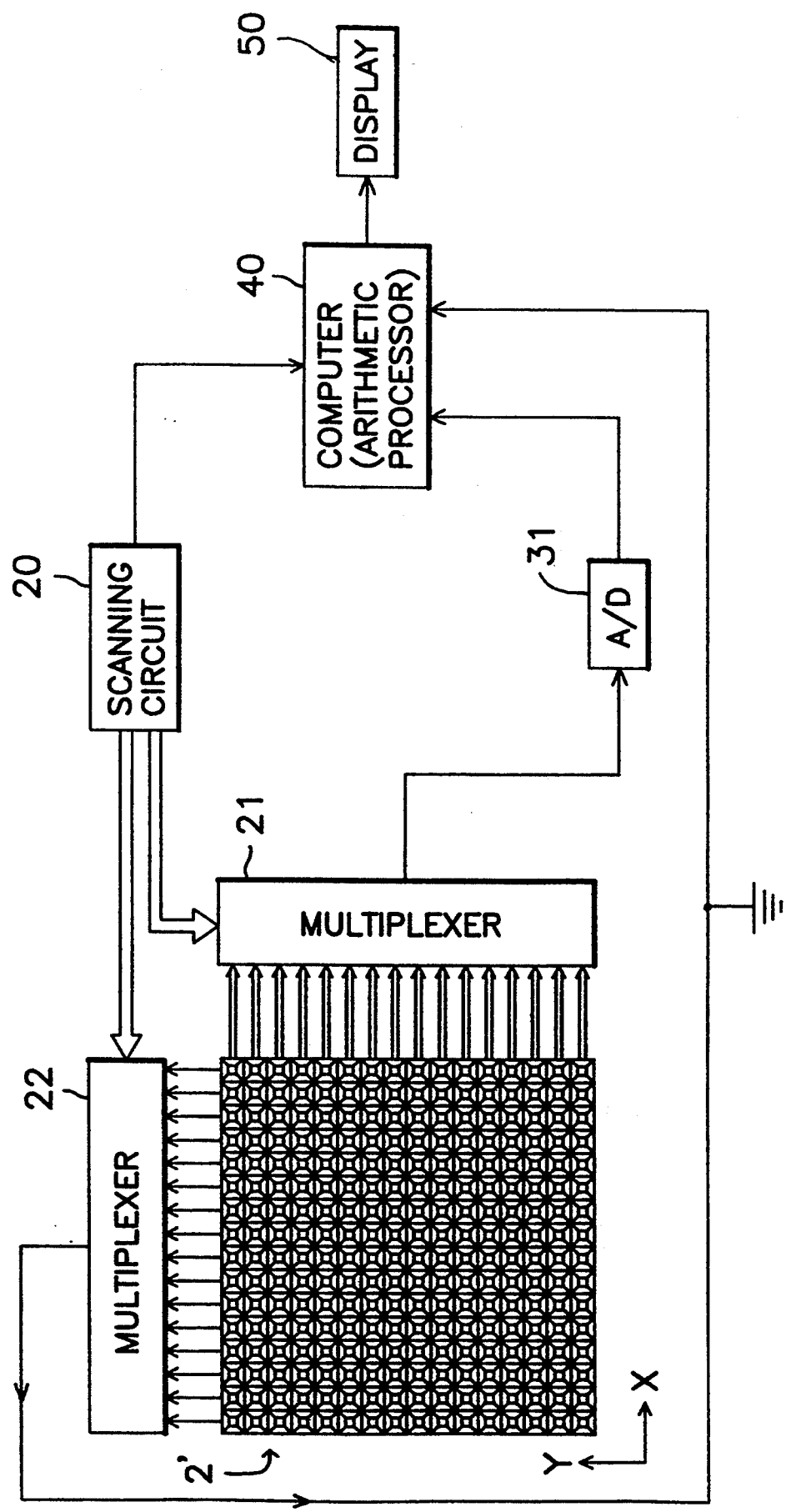
Figure 9:
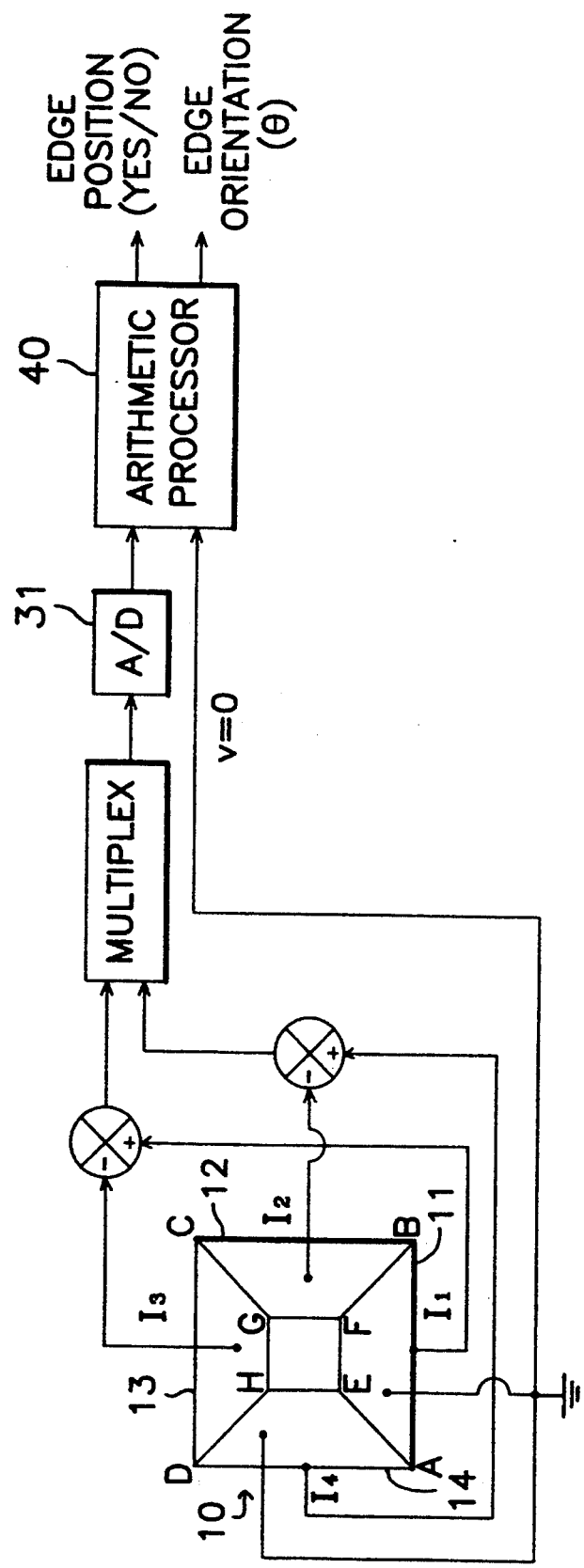

Referring to FIGS. 8–9, there is shown a schematic diagram of a pattern recognition system utilizing an image sensor 2" comprised of an array of photo-detecting cells 10 devised in accordance with the present invention. The schematic shown FIGS. 8–9 are substantially the same as that shown in FIGS. 1–2 except photo-detecting cell having differently shaped photo-sensitive surfaces is provided. As shown in FIG. 9, a photo-detecting cell 10 devised in accordance with the present invention includes four photo-diodes, a first photo-diode 11, a second photo-diode 12, a third photo-diode 13, and a fourth photo-diode 14. The photo-sensitive surfaces of the four photo-diodes 11, 12, 13, 14 are identically shaped into an isosceles trapezoid with 45° base angles, i.e. the photo-sensitive surface of the first photo-diode 11 is the area designated by the trapezoid ABFE; that of the second photo-diode 12 is the area designated by the trapezoid BCGF; that of the third photo-diode 13 is the area designated by the trapezoid CDHG; and that of the fourth photo-diode 14 is the area designated by the trapezoid DAEH. A square area EFGH, which is non-sensitive to photons, is formed at the center of the photo detecting cell 10. The square area EFGH can be used to accommodate circuit elements interconnecting the four photo-diodes 11, 12, 13, 14. Due to the non-photosensitive region enclosed by the square EFGH, the photo-detecting cell 10 of the present invention is technically termed as a "Hollow FOQUOD".

When the photo-detecting cell 10 is illuminated by a light beam, each photo-sensitive surface thereof is actuated to output an electrical current in proportion to the area of illuminated portions thereupon. Since in practice the photo-detecting cell 10 is made with a very small dimension, typically 600 μm by 600 μm, light intensity can be regarded as substantially consistent all over the surfaces thereof. In addition, with such a small dimension, image edge segment falling upon the photo-detecting cell 10 can be regarded as a straight line segment.

According to principles of the present invention, whether an image edge segment falls upon the photo-detecting cell 10 is determined by evaluating if a sum of the absolute value of $I_1$–$I_3$ and the absolute value of $I_2$–$I_4$ is equal to zero or not, i.e.

if $|I_1-I_3| + |I_2-I_4| \neq 0$, then it is determined that an image edge segment falls upon the photo-detecting cell 10, and if $|I_1-I_3| + |I_2-I_4| = 0$, then it is determined that image edge segment is not detected by the photo-detecting cell 10.

If it is determined that an image edge segment falls upon the photo-detecting cell 10, the arithmetic processor 40 proceeds to determine the orientation Θ of the edge segment according to the following relationship:

$$\Theta = \tan^{-1}\left(\frac{I_2 - I_4}{I_1 - I_3}\right)$$

Proofs to the above principles will be described hereinunder.

Figure 10:
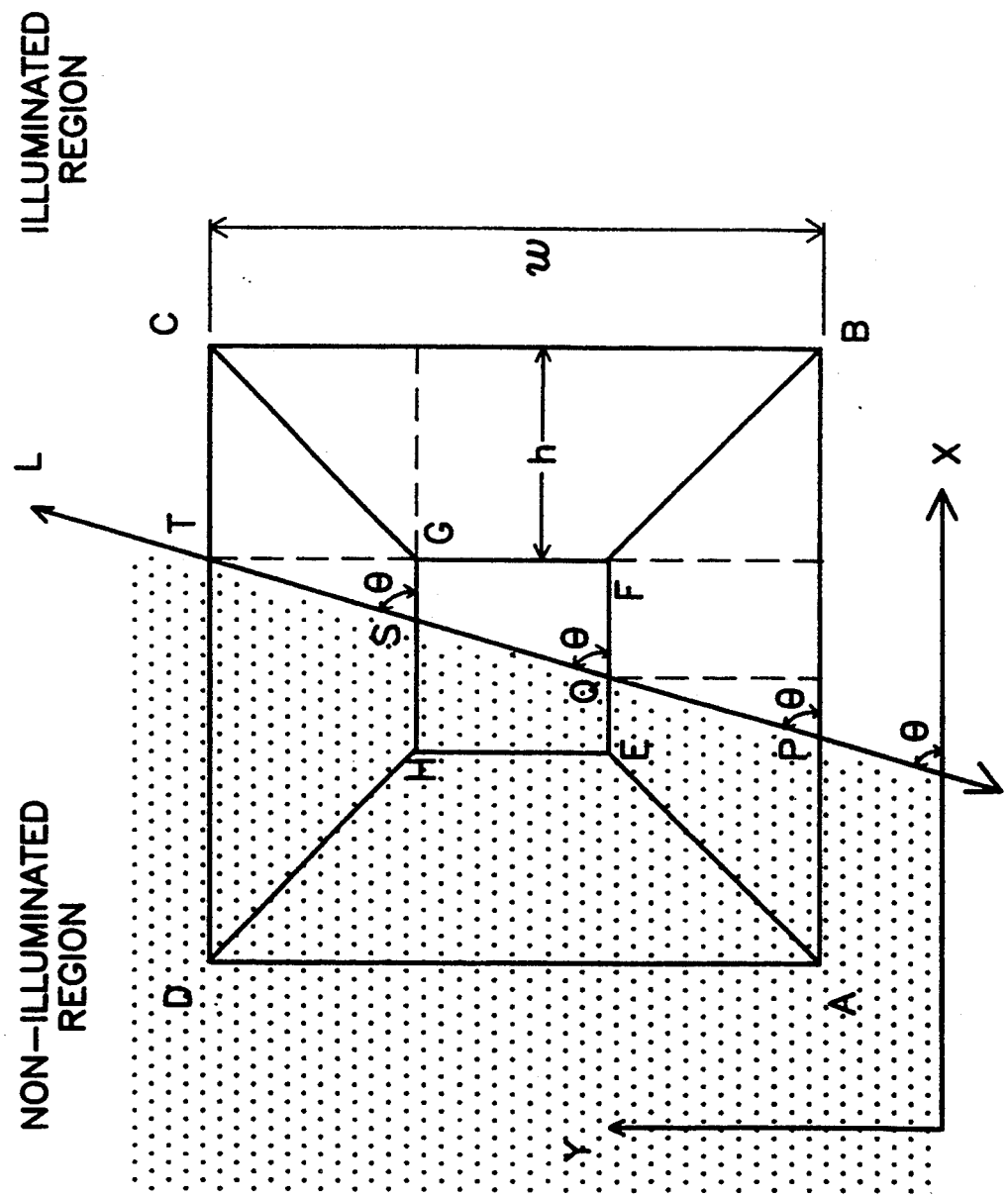

Referring to FIG. 10, it is assumed that the side length of the photo-detecting cell 10 is w and the height of each trapezoid is h. Furthermore, a line L is used to represent an image edge segment falling upon the photo-detecting cell 10. It is further assumed that the line L intercepts the trapezoid ABEF with a line segment PQ and the trapezoid CDHG with a line segment ST. To the left of the line L is a non-illuminated region and to the right of the line L is an illuminated region.

Based on the situation shown in FIG. 10, $I_1 = A \cdot P \cdot \{\text{the area of PBFQ}\}$, (1)

$I_2 = A \cdot P \cdot \{\text{the area of BCGF}\}$, (2)

$I_3 = A \cdot P \cdot \{\text{the area of CTSG}\}$, and (3)

$I_4 = 0$, where A is the quantum efficiency of the photo-diodes 11, 12, 13, 14, and P is the intensity of illumination.

If an image edge segment does not fall upon the photo-detecting cell 10, it means in other words that the surface of the photo-detecting cell 10 is either entirely non-illuminated or entirely illuminated. In the former case, $I_1 = I_2 = I_3 = I_4 = 0$;

and in the latter case, $I_1 = I_2 = I_3 = I_4 = A \cdot P \cdot \{\text{the area of the trapezoid}\} \neq 0$ Both of the two cases will make the expression $|I_1-I_3| + |I_2-I_4|$ equal to zero.

By basic principles of plane geometry, $\{\text{the area of PBFQ}\} = (PB+QF) \cdot h/2$ (5)

$\{\text{the area of BCGF}\} = (BC+FG) \cdot h/2$ (6)

$\{\text{the area of CTSG}\} = (TC+SG) \cdot h/2$ (7)

Assume SG = t, it can be deduced that:

$TC = h + t - h/\tan(\Theta)$ (8)

$FG = w - 2 \cdot h$ (9)

$QF = t + FG/\tan(\Theta)$ (10)
$= t + (w - 2h)/\tan(\Theta)$

-continued $$PB = h/\tan(\Theta) + QF + h \quad (11)$$
$$= h/\tan(\Theta) + t + (w - 2h)/\tan(\Theta) + h$$

Substitute (8), (9), (10), (11) into (5), (6), (7):

$$\{\text{the area of } PBFQ\} = [h/\tan(\Theta) + t + \quad (12)$$
$$(w - 2h)/\tan(\Theta) + h + t + (w - 2h)/\tan(\Theta)] \cdot h/2$$

$$\{\text{the area of } BCGF\} = (w + w - 2 \cdot h) \cdot h/2 \quad (13)$$
$$= (w - h) \cdot h$$

$$\{\text{the area of } CTSG\} = [h + t - h/\tan(\Theta) + t] \cdot h/2 \quad (14)$$

Therefore, $$\frac{I_2 - I_4}{I_1 - I_3} = \frac{A \cdot P \cdot \{\text{the area of } BCGF\} - 0}{A \cdot P \cdot \{\text{the area of } PBFQ\} - A \cdot P \cdot \{\text{the area of } CTSG\}} \quad (15)$$

$$= \frac{\{\text{the area of } BCGF\}}{\{\text{the area of } PBFQ\} - \{\text{the area of } CTSG\}}$$

in which $$\{\text{the area of } PBFQ\} - \quad (16)$$
$$\{\text{the area of } CTSG\} = [h/\tan(\Theta) + t + (w - 2h)/\tan(\Theta) + h + t + (w - 2h)/\tan(\Theta)] \cdot h/2 -$$
$$[h + t - h/\tan(\Theta) + t] \cdot h/2$$
$$= [(2w - 2h)/\tan(\Theta)] \cdot h/2$$
$$= [(w - h)/\tan(\Theta)] \cdot h$$

Thus, $$\frac{\{\text{the area of } BCGF\}}{\{\text{the area of } PBFQ\} - \{\text{the area of } CTSG\}} = \frac{(w - h) \cdot h}{[(w - h)/\tan(\Theta)] \cdot h} \quad (17)$$
$$= \tan(\Theta)$$

Consequently, $$\Theta = \tan^{-1}\left(\frac{I_2 - I_4}{I_1 - I_3}\right) \quad (18)$$

The first photo-diode 11 and the third photodiode 13 in combination are referred to as "an X-component detector" since the output thereof, i.e. $I_1-I_3$, is essentially proportional to $\cos(\Theta)$; and the second photo-diode 12 and the fourth photo-diode 14 in combination are referred to as "a Y-component detector" since the output thereof, i.e. $I_2-I_4$ is essentially proportional to $\sin(\Theta)$.

SIMULATION OF PERFORMANCE

Figure 11:
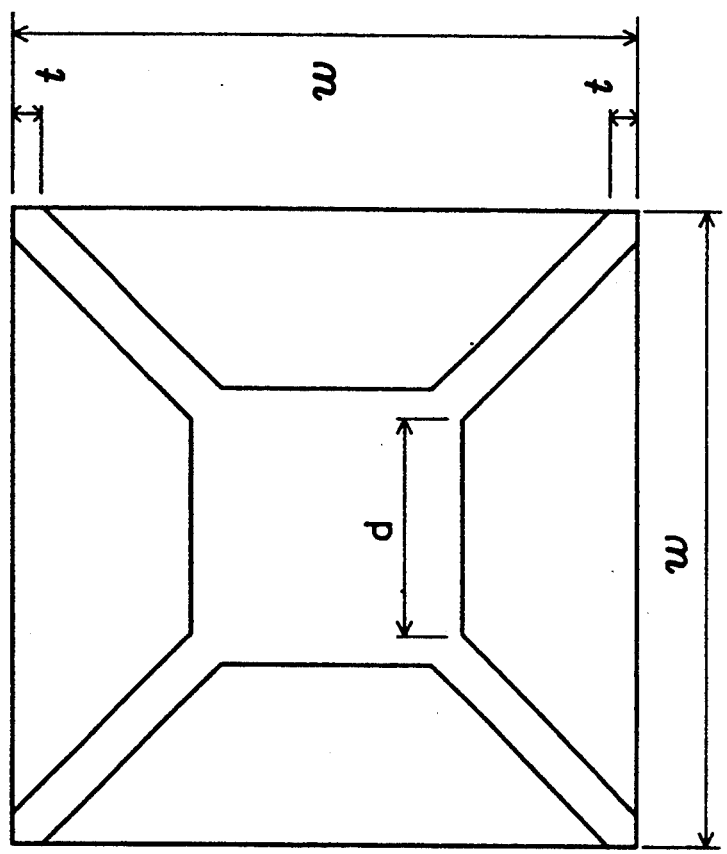

As shown in FIG. 11, when the photo-detecting cell 10 is practically implemented on a semiconductor chip, there are strips of non-photosensitive region provided to isolate the four trapezoidal photo-sensitive surfaces from each other. The side length of the photo-detecting cell, for comparison purpose, is the same as that of the prior art FOQUOD of FIG. 3. The top side length of each trapezoid is d.

Figure 12:
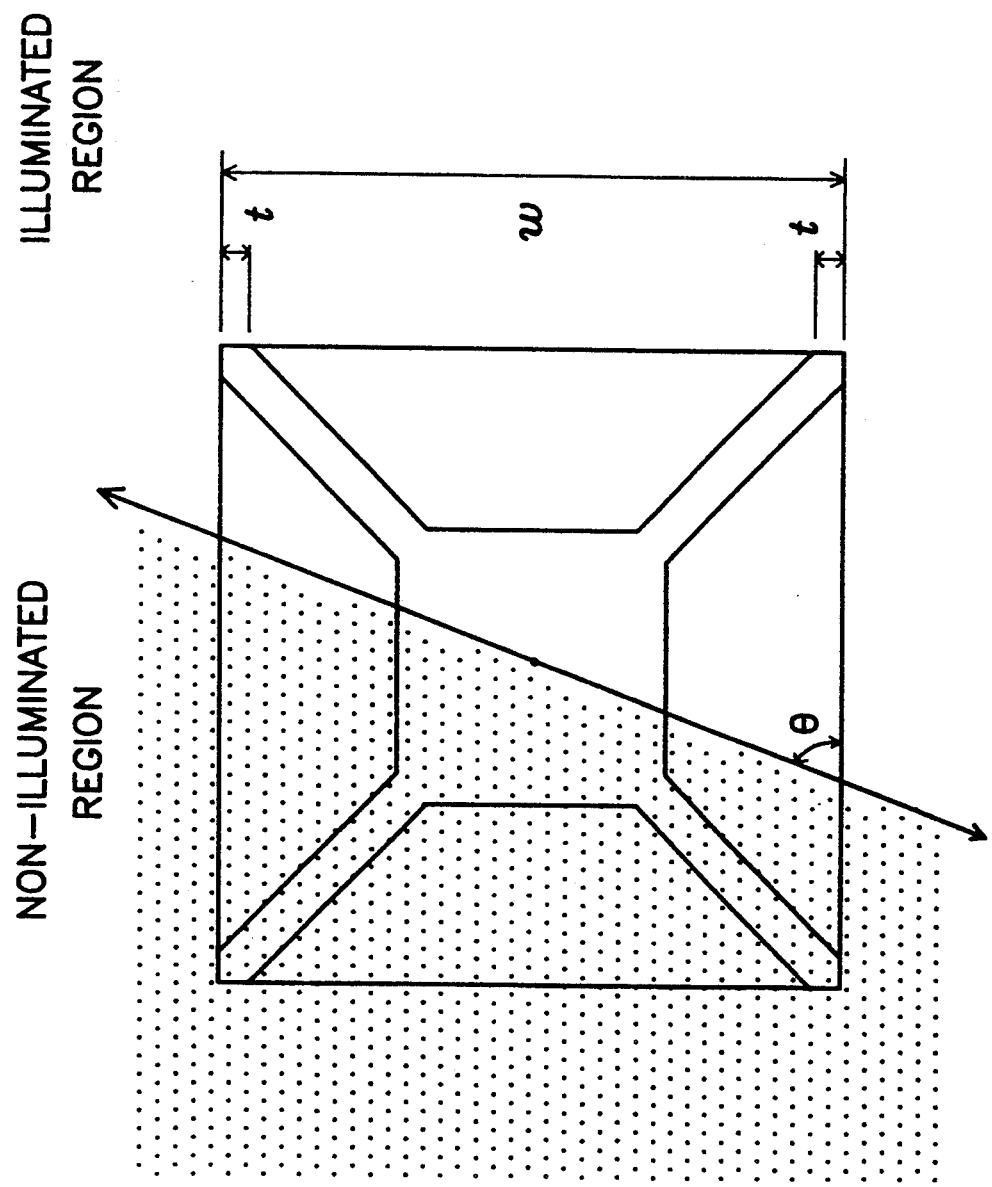
Figure 13:
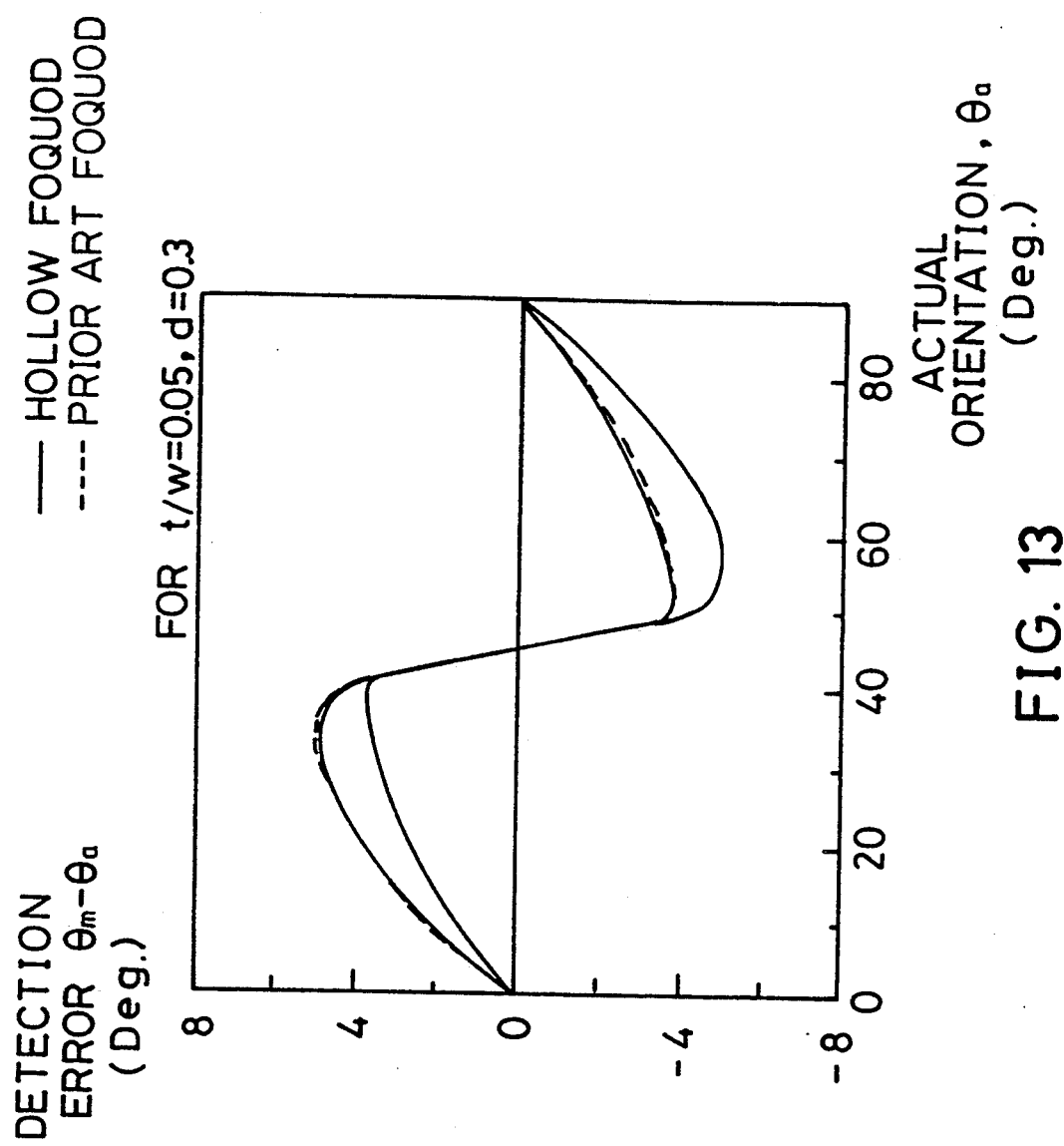

As shown in FIG. 12, the first simulation as conducted to the prior art FOQUOD is conducted again to the photo-detecting cell of FIG. 11, which is fashioned with t/w=0.05 and d/w=0.3. The result is plotted in a graph shown in FIG. 13, along with the plot corresponding to a sample of the prior art FOQUOD with t/w =0.05 . It can be seen from the graph of FIG. 13 that when the orientation is within about from 40° to 50°, i.e. the image edge segment falls substantially upon the non-photosensitive region, the performance is not much improved. However, outside of this range, detected orientation error is reduced, indicating about a 25% improvement.

Figure 14:
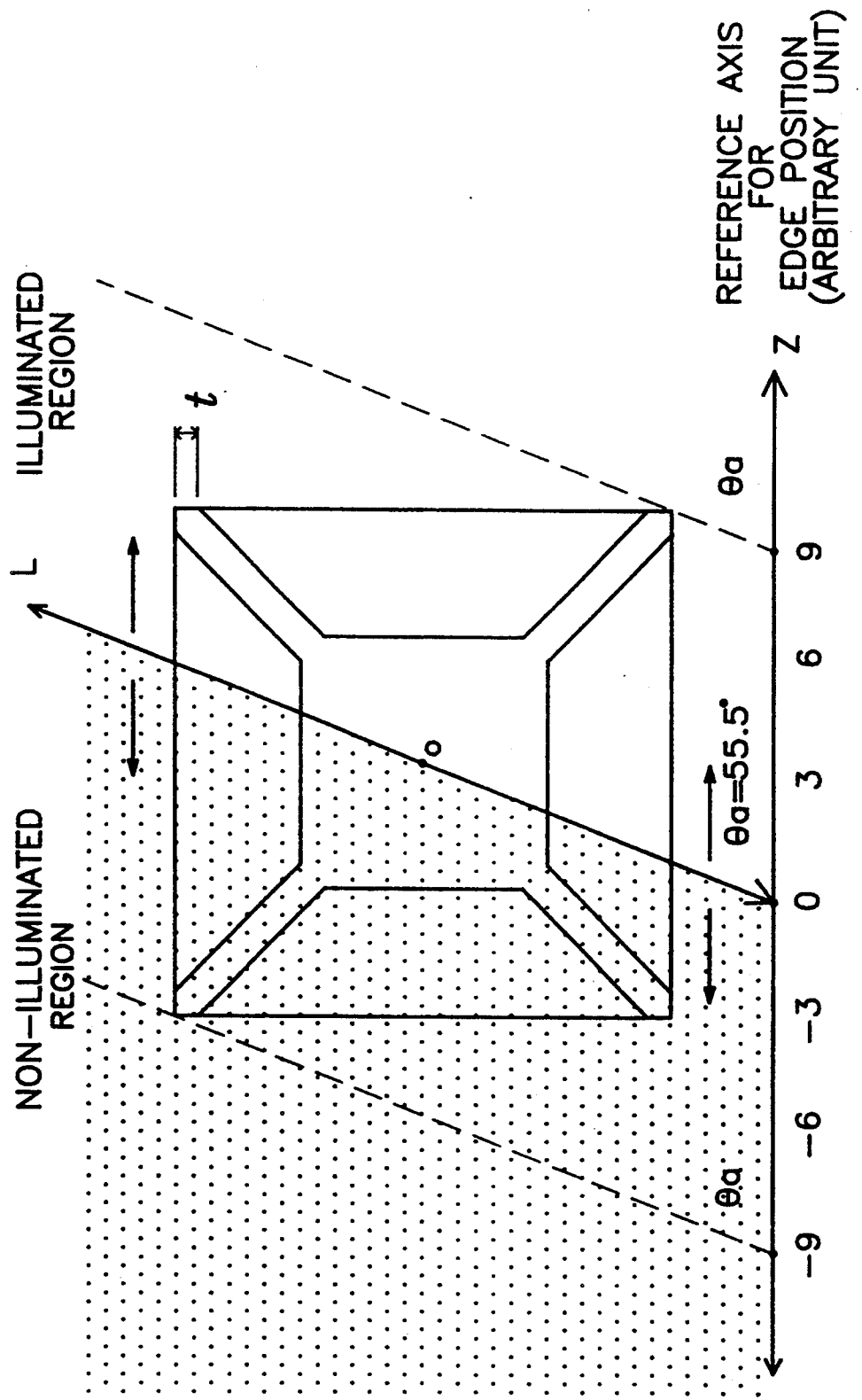
Figure 15:
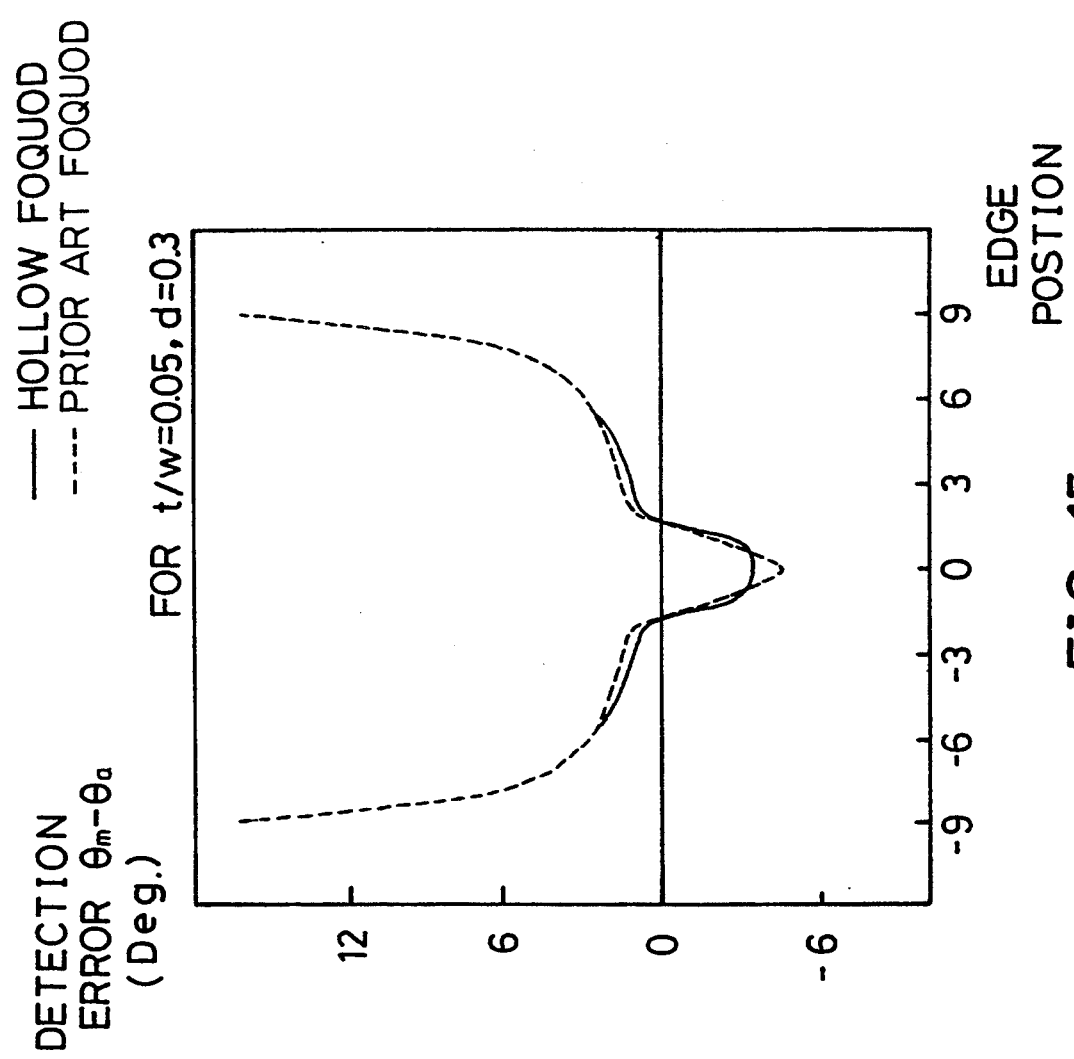

As shown in FIG. 14, the second simulation as conducted to the prior art FOQUOD is conducted again to the photo-detecting cell of FIG. 11. The result is plotted in a graph shown in FIG. 15, along with the plot corresponding to a sample of the prior art FOQUOD with t/w=0.05. It can be seen from the graph of FIG. 15 that improvement to detected orientation error is especially noted when the line L is located at the position Z=0.

Process for Fabricating the Photo-Detecting Cell 10

Semiconductor technology is utilized for the fabrication of the photo-detecting cell 10. It is particularly an important aspect of the present invention that a material of hydrogenated amorphous silicon (hereinafter abbreviated as a-Si:H) is used to fabricate the photo-diodes 11, 12, 13, 14.

Described hereinunder is a step-by-step description of a process for fabricating the photo-detecting cell 10 with references made to FIGS. 16A–16G, in which cross-sectional views are shown only for a pair of oppositely disposed photo-diodes. The fabrication process includes the following steps:

STEP 1 : ( FIG. 16A )

coating a layer of Cr 200 upon a substrate 100 of $SiO_2$ to a thickness of 1600Å by using a thermal evaporaation process at a pressure of $3 \times 10^{-5}$ Torr. and a temperature of 250° C.;

STEP 2 : (FIG. 16B)

removing a portion 210 of the Cr layer 200 by etching to create two electrically isolated Cr layers, a first Cr layer 200a and a second Cr layer 200b;

STEP 3 : (FIG. 16C)

under a pressure of 0.5 Torr. and a temperature of 250° C. and by using an RF glow discharge process with a power of 0.1–1 W, depositing a layer of n+a-Si:H 310 upon the Cr layers 200a, 200b to a thickness of 200 Å, depositing a layer of undoped a-Si:H 320 upon the layer of n+a-Si:H 310 to a thickness of 3500 Å, and depositing a layer of p+a-Si:H 330 upon the layer of undoped a-Si:H 320 to a thickness of 100 Å;

STEP 4 : (FIG. 16D)

depositing a layer of ITO (InSn Oxide) 400 upon the layer of p+a-Si: H 330 to a thickness of 1000 Å; (Sn oxide, Zn oxide can also be used to deposit this layer.)

STEP 5 : (FIG. 16E)

removing a portion 410 of the ITO layer 400 by etching to divide the ITO layer 400 into two electrically isolated layers, a first ITO layer 400a and a second ITO layer 400b;

STEP 6 : (FIG. 16F)

removing portions of the deposited layers 400a, 330, 320, 310 by etching to create a hollow portion 90 allowing the second Cr layer 200b to be exposed, the aSi:H layers 310, 320, 330 being thereby divided into first a-Si:H layers 310a, 320a, 330a and second a-Si:H layers 310b, 320b, 330b;

STEP 7 : (FIG. 16G)

forming a conducting path 500 electrically connecting the first ITO layer 400a to the second Cr layer 200b by depositing an alloy of Au/Cr into the hollow portion 91, this step being carried out by using thermal evaporation process under a pressure of $3 \times 10^{-5}$ Torr. and a temperature of 75° C.

Figure 16A:
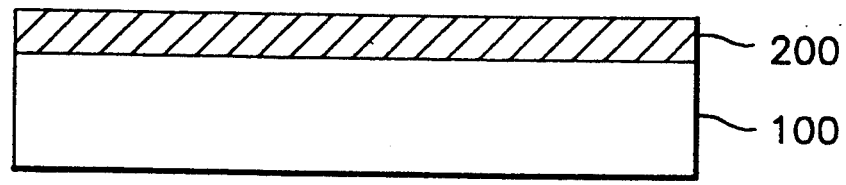
FIGS. 16A–16G are cross-sectional illustrations, each of which is used to show a step in the fabrication process of an individual photo-detecting cell utilized in the pattern recognition system of FIG. 8.
Figure 16B:
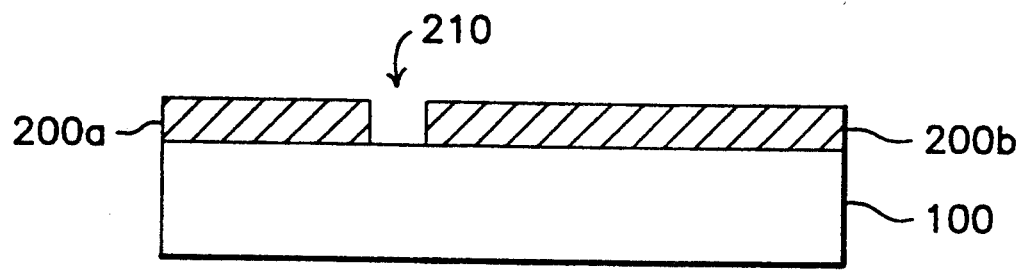
Figure 16C:
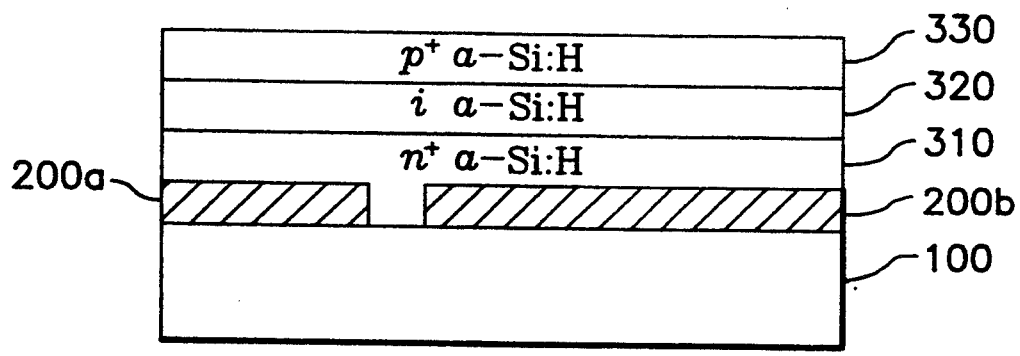
Figure 16D:
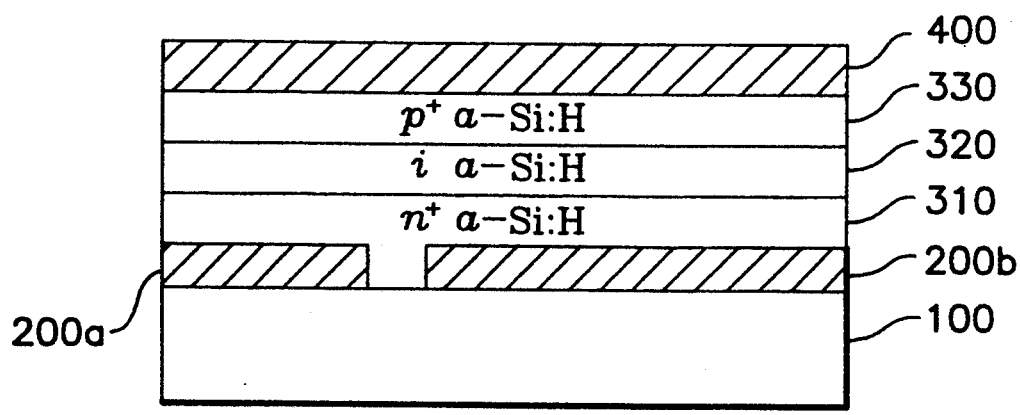
Figure 16E:
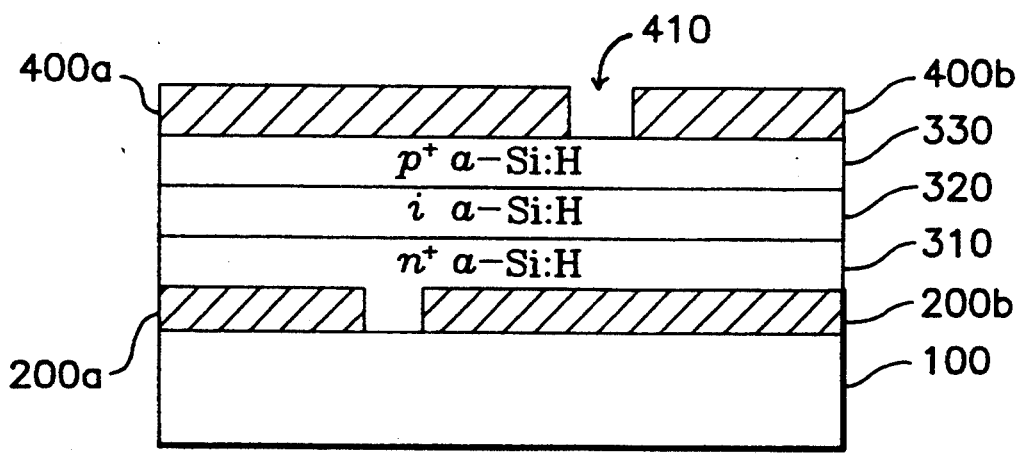
Figure 16F:
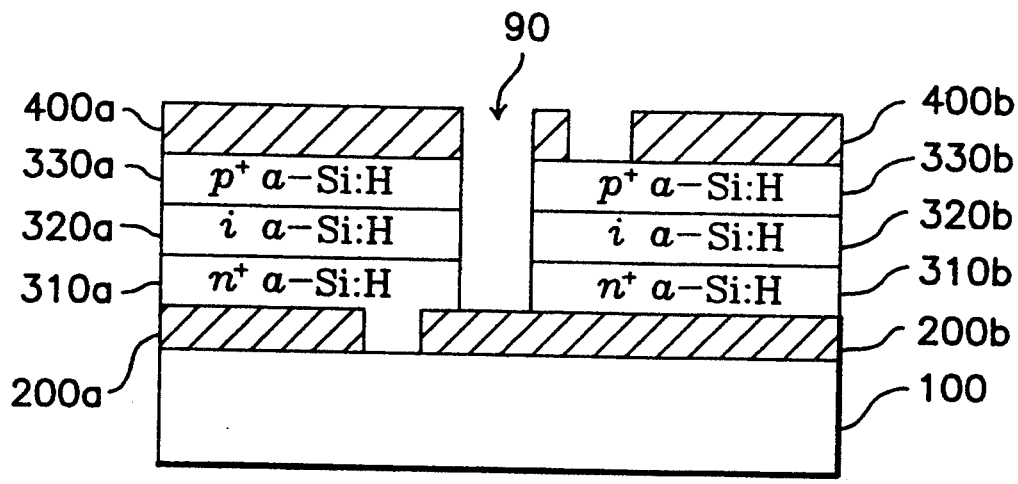
Figure 16G:
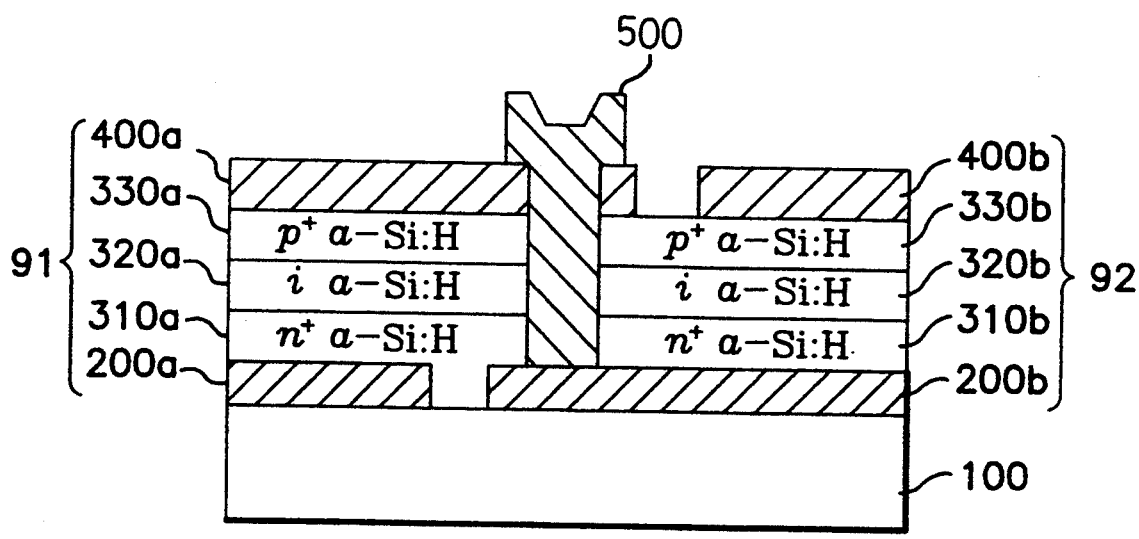
Figure 17:
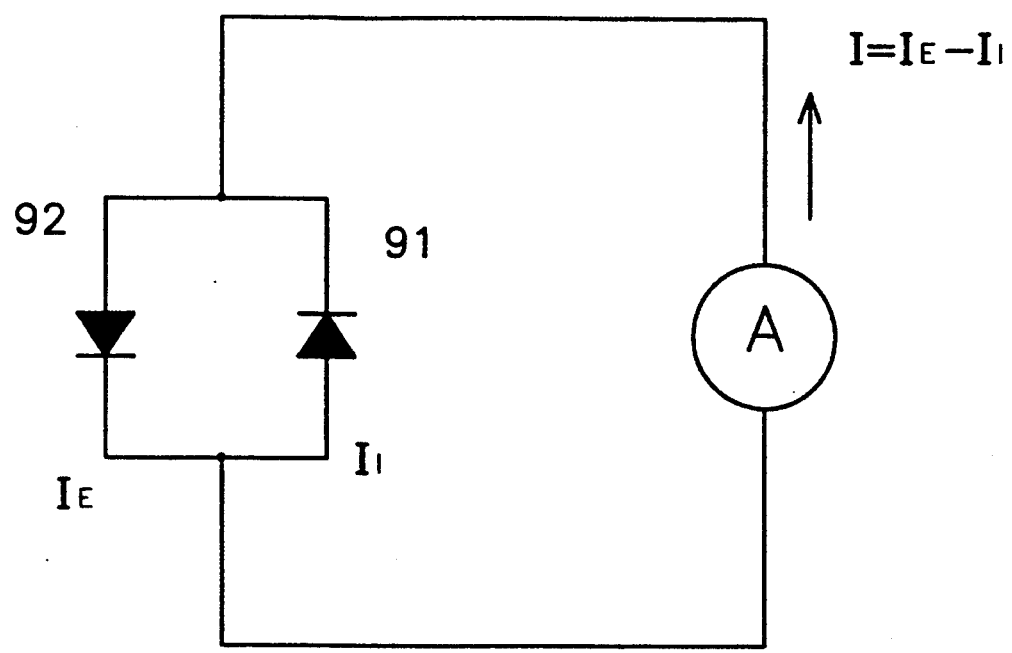

Referring to the product shown in FIG. 16G, the layers 200a, 310a, 320a, 330a, and 400a in combination form an inhibitory photo-diode 91 with the layer 400a thereof used as the photo-sensitive surface; and the layers 200b, 310b, 320b, 330b, and 400b in combination form an excitatory photo-diode 92 with the layer 400a thereof used as the photo-sensitive surface. An equivalent circuit of the back-to-back connected photo-diodes 91, 92 is shown in FIG. 17. When the inhibitory photo-diode 91 receives photons, a negative current is output; and when the excitatory photo-diode 92 receives photons, a positive current is output.

The present invention has been described hitherto with an exemplary preferred embodiment. However, it is to be understood that the scope of the present invention need not be limited to the disclosed preferred embodiment. On the contrary, it is intended to cover various modifications and similar arrangements within the scope defined in the following appended claims. The scope of the claims should be accorded the broadest interpretation so as to encompass all such modifications and similar arrangements.

What is claimed is:

1. A pattern recognition system, comprising:
   (a) an image sensor including an array of photo-sensing cells for detecting images, each photo-sensing cell consisting of four identically shaped photo-sensing surfaces, each photo-sensing surface being shaped into a plane trapezoid having a base side, a top side parallel to and shorter than the base side, and a pair of equilateral sides, the equilateral sides intersecting the base side with 45° angles, said four photo-sensitive surfaces being arranged with a topology in which the four base sides thereof form a first square and the four top sides thereof form a second square enclosing an area of non-photosensitive region, said photo-sensing cell being capable of generating electrical signals in proportion to the areas of illuminated portions upon said photo-sensitive surfaces when portions of said image sensor are illuminated by light beams representing images; and
   (b) means, responsive to the electrical signals generated by said array of photo-sensing cells, for extracting edges of images detected by said image sensors;
   (c) means, response to the electrical signals generated by said array of photo-sensing cells and said edge extracting means, for determining the orientations of edge points of the extracted image edges.

2. A pattern recognition system according to claim 1, wherein said edge extracting means determines that image edge falls upon a particular photo-sensing cell if the value of:

$|I_1-I_3| + |I_2-I_4|$, is non-zero, and image edge does not fall upon the particular photosensing cell if the value of:

$|I_1-I_3| + |I_2-I_4|$, is zero, where $I_1$ and $I_3$ are the electrical signals generated by one pair of oppositely arranged photo-sensing surface of the particular photo-sensing cell, and $I_2$ and $I_4$ are the electrical signals generated by another pair of oppositely arranged photo-sensing surfaces of the particular photo-sensing cell.

3. A pattern recognition system according to claim 2, wherein said orientation determining means determines the orientations of edge points in the image edges extracted by said edge extracting means in accordance with the value of:

$$\tan^{-1}\left(\frac{I_2 - I_4}{I_1 - I_3}\right).$$

4. A photo-sensing device capable of determining the orientation of a borderline between an illuminated portion and a non-illuminated portion thereupon, the borderline being substantially a straight line, said photo-sensing device comprising:
   (a) a photo-detecting cell consisting of four identically shaped photo-sensitive surfaces, each photo-sensitive surface being shaped into a plane trapezoid having a base side, a top side parallel to and shorter than the base side, and a pair of equilateral sides, the equilateral sides intersecting the base side with 45° angles, said four photo-sensitive surfaces being arranged with a topology in which the four base sides thereof form a first square and the four top sides thereof form a second square ellclosing an area of non-photosensitive region, said photo-detecting cell being capable of generating electrical signals in proportion to the areas of illuminated portions upon said photo-sensitive surfaces when light beam is incident thereupon; and
   (b) means, responsive to the electrical signals generated by said photo-detecting cell, for determining the orientation of the borderline.

5. A photo-sensing device according to claim 4, further comprising:
   means, responsive to the electrical signals generated by said photo-detecting cell, for determining whether said photo-sensing device is partly illuminated and partly non-illuminated.

6. A photo-sensing device according to claim 4, wherein the orientation of the borderline between the illuminated portion and the non-illuminated portion on said photo-sensing device is determined in accordance with the value of:

$$\tan^{-1}\left(\frac{I_2 - I_4}{I_1 - I_3}\right)$$

where $I_1$ and $I_3$ are the electrical signals generated by one pair of oppositely arranged photo-sensitive surfaces, and $I_2$ and $I_4$ are the electrical signals generated by another pair of oppositely arranged photo-sensitive surfaces.

7. A photo-sensing device according to claim 4, wherein said photo-detecting cell is partly illuminated and partly non-illuminated if the value of:

$|I-I_3| + |I_2-I_4|$ is non-zero, and said photo-detecting cell is either entirely illuminated or entirely non-illuminated if the value of:

$|I_1-I_3| + |I_2-I_4|$ is equal to zero, where $I_1$ and $I_3$ are the electrical signals generated by one pair of oppositely arranged photo-sensitive surfaces, and $I_2$ and $I_4$ are the electrical signals generated by another pair of oppositely arranged photo-sensitive surfaces.

* * * * *